(12) United States Patent
Beutler et al.

(10) Patent No.: US 7,016,490 B2
(45) Date of Patent: Mar. 21, 2006

(54) CIRCUIT BOARD CAPACITOR STRUCTURE FOR FORMING A HIGH VOLTAGE ISOLATION BARRIER

(75) Inventors: Thomas Grey Beutler, Tustin, CA (US); Raphael Rahamim, Orange, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 543 days.

(21) Appl. No.: 09/862,689

(22) Filed: May 21, 2001

(65) Prior Publication Data

US 2002/0172351 A1    Nov. 21, 2002

(51) Int. Cl.
*H04M 1/00* (2006.01)
*H04M 9/00* (2006.01)
*H04M 9/08* (2006.01)

(52) U.S. Cl. ....................................................... 379/412

(58) Field of Classification Search ................ 379/391, 379/399.01, 412, 402, 405, 414, 442, 443
See application file for complete search history.

(56) References Cited

U.S. PATENT DOCUMENTS

| | | | | |
|---|---|---|---|---|
| 4,761,881 A | * | 8/1988 | Bora et al. | 29/840 |
| 4,870,746 A | | 10/1989 | Klaser | 29/620 |
| 5,172,304 A | * | 12/1992 | Ozawa et al. | 361/763 |
| 5,870,046 A | * | 2/1999 | Scott et al. | 341/143 |
| 5,972,053 A | | 10/1999 | Hoffarth et al. | 29/25.03 |
| 5,978,231 A | | 11/1999 | Tohya et al. | 361/782 |
| 6,021,050 A | | 2/2000 | Ehman et al. | 361/793 |
| 6,043,987 A | | 3/2000 | Goodwin et al. | 361/763 |
| 6,137,671 A | * | 10/2000 | Staffiere | 361/311 |

\* cited by examiner

*Primary Examiner*—Curtis Kuntz
*Assistant Examiner*—Alexander Jamal
(74) *Attorney, Agent, or Firm*—Christopher J. Rourk; Godwin Gruber LLP

(57) ABSTRACT

A circuit board capacitor structure operable as a high voltage isolation barrier in communication circuitry. Capacitor electrodes form a capacitive structure directly on a printed circuit board's opposing sides. The PCB substrate intermediate the electrodes functions as the capacitive structure's dielectric material. The capacitor electrodes are sized such that the electrodes' area and the substrate's dielectric properties create the desired capacitance. Alternatively, a multi-layered PCB may be utilized where layer(s) is/are used to form the capacitive structure. The circuit board capacitor may couple communication circuitry located on the PCB's various sides. The circuit board capacitor operates as a high voltage isolation barrier in data access arrangements, separating line and system side circuitry. Further, the high voltage isolation barrier may include multiple circuit board capacitors to realize differential communications and/or multiple datapaths. The capacitor structure can be flexibly arranged to minimize PCB real estate and be more cost-effective than discrete capacitors.

27 Claims, 7 Drawing Sheets

CIRCUIT BOARD CAPACITOR STRUCTURE FOR FORMING A HIGH VOLTAGE ISOLATION BARRIER

CROSS REFERENCE TO RELATED APPLICATIONS

The following U.S. patent applications are hereby incorporated herein by reference in their entirety and made part of the present U.S. patent application for all purposes:

U.S. patent application Ser. No. 09/193,222, entitled "Modem Having a Digital High Voltage Isolation Barrier," filed Nov. 16, 1998.

U.S. patent application Ser. No. 09/290,524, entitled "Multifunction Data Access Arrangement," filed Apr. 12, 1999.

1. Field of the Invention

The present invention relates generally to communication devices for coupling to an external communication medium; and, more particularly, it relates to printed circuit board capacitor structure for use as a high voltage isolation barrier.

2. Related Art

Communication devices coupled to a telephone line or similar transmission medium generally must adhere to rigid electrical isolation requirements. Subscriber equipment or data communications equipment (DCE), such as data modems, typically provide for some form of electrical isolation to prevent voltage surges or transients originating from the subscriber equipment or lightning from having a deleterious effect on the telephone network and vice versa. Electrical isolation also addresses potential problems associated with differences in operating voltages between a telephone line and the subscriber equipment. More particularly, telephone line voltages may vary widely across a given network, and often exceed the operating voltage of subscriber equipment. In the United States, 1,500 volt isolation is currently required. In other countries, the prescribed isolation may reach 3,000–4,000 volts.

Isolation transformers are regularly employed to magnetically couple signals between a two-wire telephone line and the analog front end of a modem or other circuit while maintaining an appropriate level of electrical isolation. The isolation transformer functions to block potentially harmful DC components, thereby protecting both sides of the data connection.

The isolation transformer is typically part of what is referred to in the modem arts as a data access arrangement (DAA). The term DAA generally indicates circuitry which provides an interface between a public telephone network originating in a central office (CO) and a digital data bus of a host system or data terminal equipment (DTE). The DAA electrically isolates a modem or similar device from a phone line to control emissions of electromagnetic interference/radio frequency interference (EMI/RFI). In addition to electrical isolation, the DAA may develop a number of signals (e.g., a ring signal) for provision to subscriber equipment. The DAA generally receives signals from the phone line through a telephone jack, such as a RJ11C connection as used for standard telephones.

Some modem configurations utilize a DAA having line side circuitry including telephone network interface and system side circuitry including a host system interface, the line side circuitry and system side circuitry being separated by the high voltage isolation barrier. Power for line side circuitry may be communicated from the host system across an isolation transformer or other isolation barrier.

Typically, a number of circuits must derive information from the telephone line, and isolation is often required for each signal communicated to and from the host system. Such circuits may include: transmit and receive circuitry; ring signal detection circuitry; circuitry for switching between voice and data transmissions; circuits for dialing telephone numbers; line current detection circuitry; circuitry for indicating that the equipment is coupled to a functional telephone line; and line disconnection detection circuitry. Conventional DAA designs utilize separate line side circuits and separate signal paths across a high voltage isolation barrier for each function of the DAA.

While the isolation transformer of a DAA protects the electronic components of a modem, it often introduces distortion and consumes a relatively large amount of space. In today's world of ever-shrinking electronics, the bulk of the isolation transformer may govern the physical dimensions of the modem itself and impose other unwanted constraints on cost sensitive modem circuitry.

One method for reducing the size of the isolation transformer in a DAA involves coupling certain telephone line signals (e.g., incoming ringing signals) to modem circuitry while utilizing a separate signal path to couple data signals via a capacitively coupled isolation transformer. Although enabling the use of smaller and lighter isolation transformers, this configuration may result in excessive distortion.

Some modem configurations have eliminated the isolation transformer altogether via the use of analog electro-optical isolators. These devices employ an emitter, such as a light emitting diode, and a corresponding photo-detector circuit. This type of isolation, however, may suffer from distortion, cost and complexity issues.

Still other configurations have used an isolation transformer in the main signal path and optical isolators or relays in the ring detection and off-hook driving circuitry. Capacitors have also been utilized to differentially couple analog transmit and receive channels across an isolation barrier. Thermal and resistive isolation techniques have also been employed, but are typically complex and expensive to manufacture.

The requirement of passing analog audio signals across the high voltage isolation barrier for provision to a coder/decoder (CODEC) and other DAA circuitry hampers efforts to decrease the size and cost of the barrier due to the foregoing design constraints. Further, each signal path across the barrier adds to size and expense of the high voltage isolation barrier.

The discrete components of the DAA are generally mounted and interconnected on a printed circuit board. The discrete components are typically mounted on one or more surfaces of the printed circuit board. Likewise, many of the conductors used to interconnect the discrete components are printed on one or more surfaces of the printed circuit board. In order to reduce the complexity, cost and size of the end product, it is therefore desirable to reduce the number of discrete components disposed on a printed circuit board.

Further limitations and disadvantages of conventional and traditional systems will become apparent to one of skill in the art through comparison of such systems with the present invention as set forth in the remainder of the present application with reference to the drawings.

SUMMARY

Briefly, the present invention relates to a circuit board capacitor structure capable of being used as a high voltage isolation barrier in communication circuitry. The capacitor structure can be flexibly arranged to maximize use of board space, and results in a reduced number of relatively expensive discrete components.

In one embodiment of the invention, a capacitive structure is created by forming capacitor electrodes directly on opposing sides of a printed circuit board. The substrate of the printed circuit board intermediate the electrodes functions as a dielectric material to complete the capacitive structure. The electrodes of the capacitor are sized such that the area of the electrodes and the dielectric properties of the substrate of the circuit board result in the desired capacitance. The circuit board capacitor may be used, for example, as a high voltage isolation barrier in a data access arrangement, wherein it separates line side circuitry and system side circuitry.

The electrodes may be formed using conventional circuit board manufacturing techniques, including the use of a screening or photolithographic process in which unwanted portions of a layer of copper bonded to the substrate are selectively etched away in an acid etch bath after the copper layer has been coated with a photoresist, exposed to a source of ultraviolet light through a photo mask containing the desired pattern of electrodes and conductors, and then developed using, for example, a potassium carbonate solution. Polymer thick films and/or conductive inks may likewise be used in the formation of the capacitor electrodes. The electrodes may be composed of a number of materials, such as copper or aluminum.

Numerous alternate embodiments of the circuit board capacitor and associated circuitry are contemplated. For example, a multi-layered printed circuit board may be utilized in which two or more layers are used in the formation of the capacitive structure. Likewise, the circuit board capacitor may connect communication circuitry located on more than one side of a circuit board. Further, more than one circuit board capacitor may be used in a high voltage isolation barrier, such that differential communications and/or multiple datapaths can be realized.

A capacitive structure implemented in accordance with the present invention thus allows usage of circuit board space to be optimized, and provides a cost effective alternative to the discrete capacitors used in prior communication circuits.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
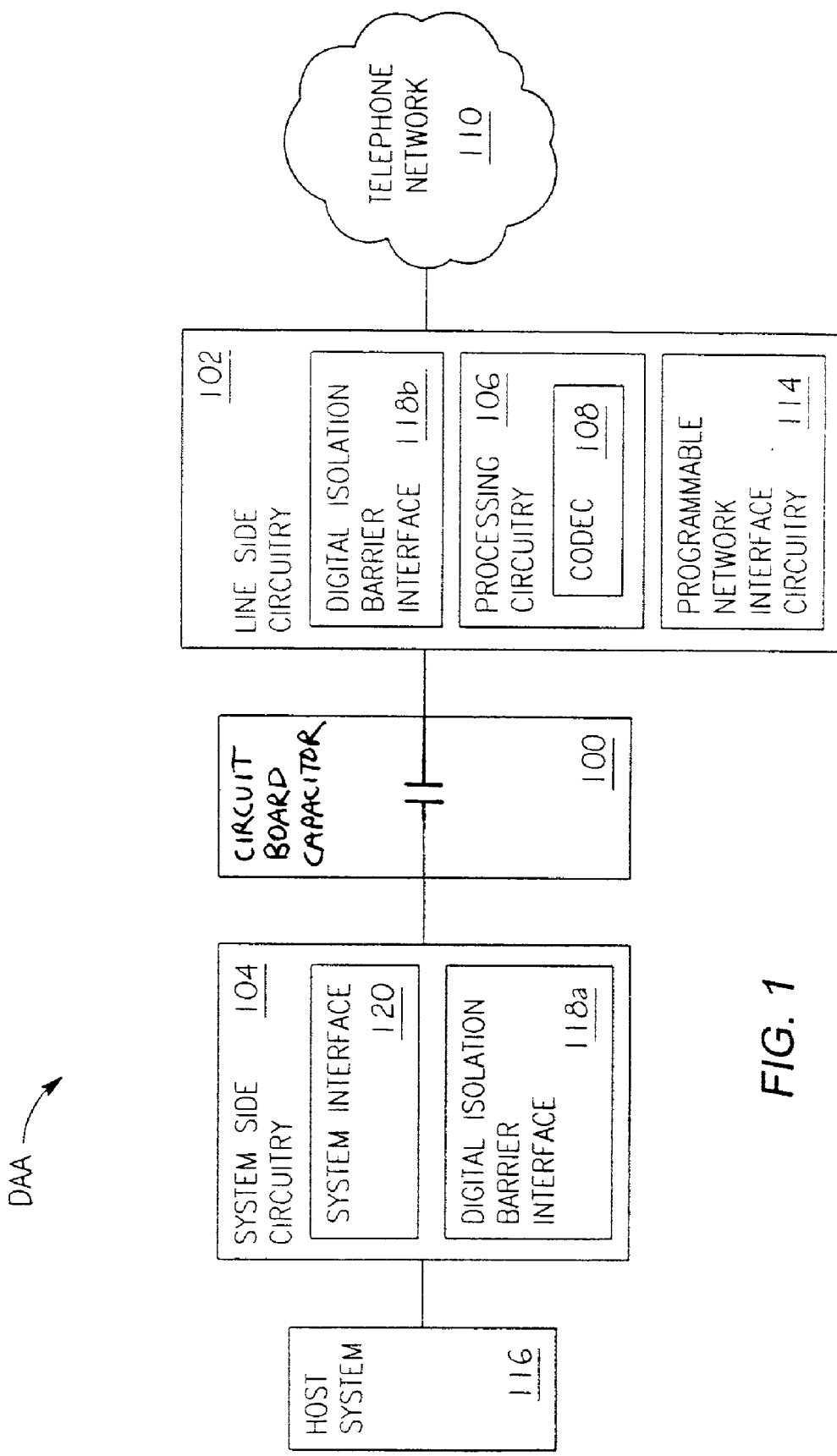
FIG. 1 is a drawing of a data access arrangement utilizing an exemplary circuit board capacitor structure implemented in accordance with the present invention.

FIG. 1 is a block diagram of a Data Access Arrangement (DAA) utilizing an exemplary circuit board capacitor structure 100 implemented in accordance with the present invention. In the illustrated embodiment, the circuit board capacitor 100 functions as a high voltage isolation barrier, although many other uses are contemplated. The circuit board capacitor 100 permits optimal usage of circuit board space, and provides a cost-effective alternative to the discrete capacitors used in prior communication circuits.

In one embodiment of the invention discussed below, the circuit board capacitor 100 is created by forming capacitor electrodes directly on opposing sides of a printed circuit board. The substrate of the printed circuit board intermediate the electrodes functions as a dielectric material to complete the capacitive structure. The electrodes of the capacitor are sized such that the area of the electrodes and the dielectric constant of the dielectric material result in the desired capacitance.

The DAA of FIG. 1 includes programmable line side circuitry 102 communicatively coupled to system side circuitry 104 via the circuit board capacitor 100. The circuit board capacitor 100, in conjunction with programmable features of the line side circuitry 102 which interface with a telephone network 110, provide the necessary level of electrical isolation between the line side circuitry 102 and the corresponding system side circuitry 104. The circuit board capacitor 100 is designed such that the DAA complies with both the U.S. and international requirements for voltage isolation.

The system circuitry 104 includes a system interface 120 and a digital isolation barrier interface 118a. The system interface 120 coordinates communications with host system circuitry 116, while the digital isolation barrier interface 118a is communicatively coupled to the circuit board capacitor 100. Data, control and programming signals may all be communicated across the circuit board capacitor 100.

The programmable line side circuitry 102 includes a digital isolation barrier interface 118b corresponding to the digital isolation barrier interface 118a of the system side circuitry 104. The programmable line side circuitry 102 also includes processing circuitry 106 and programmable network interface circuitry 114. Many functions may be performed by the programmable network interface circuitry 114, including measuring and establishing electrical parameters that are reflective of the condition of the lines of the telephone network 110.

The processing circuitry 106 of FIG. 1 includes a coder/decoder (CODEC) 108. The CODEC 108 functions to encode analog signals on the lines of the telephone network 110 into a digital format, and also provides decoded digital signals for analog transmission over the telephone network 110. Inclusion of the CODEC 108 on the line side of the circuit board capacitor 100 facilitates communications with the line side circuitry 102 by reducing the number of signals communicated across the circuit board capacitor 100 and facilitating programmability of the network interface circuitry 114.

Programmability of the network interface circuitry 114 may be achieved in a variety of ways. For example, if the host system circuitry 116 desires to program a particular feature of the line side circuitry 102 (e.g., vary line/ring impedance), a command or programming signal is communicated to the system side 104. The command or programming signal may be reconfigured for a transmission to the line side circuitry 102 in a digital manner via the circuit board capacitor 100. Alternatively, the command or programming signal may originate in the system side circuitry 104, or be directed towards a system side circuitry 104 by the line side circuitry 102. Command or programming signals may be multiplexed and serialized for transmission across the circuit board capacitor 100, thereby reducing the complexity and expense of the isolation barrier. Data signals may also be combined with the command or programming signals, further simplifying the isolation barrier.

A DAA in accordance with the invention can be utilized with any product that interfaces a telephone network 110 connection to any digital signal processor technology, where any processor of host system circuitry 116 that performs analog modem modulations. Examples include, but are not limited to, data modems, computers, web browsers, set top boxes, fax machines, cordless telephones and telephone answering machines. In addition, many different interfaces with the telephone network 110 and/or other transmission media are contemplated, such that the DAA may be configured to be compatible with whichever means is utilized. The DAA may be internal or external to a host system. The circuit board capacitor 100 may also be used for applications other than a DAA, such as radio frequency (RF) circuitry.

Figure 2A:
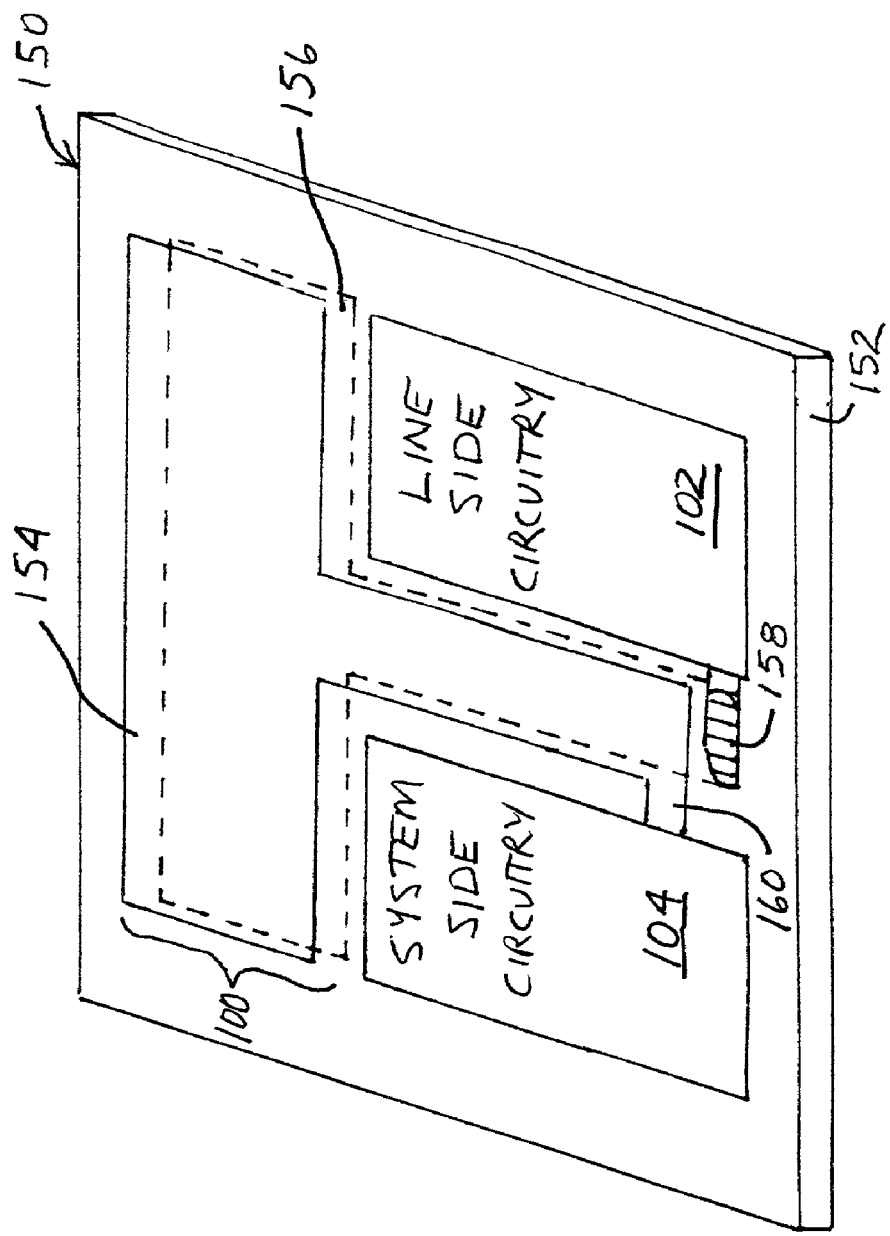
FIGS. 2A and 2B are perspective views of exemplary embodiments of the circuit board capacitor structure for use with the data access arrangement of FIG. 1.
Figure 2B:
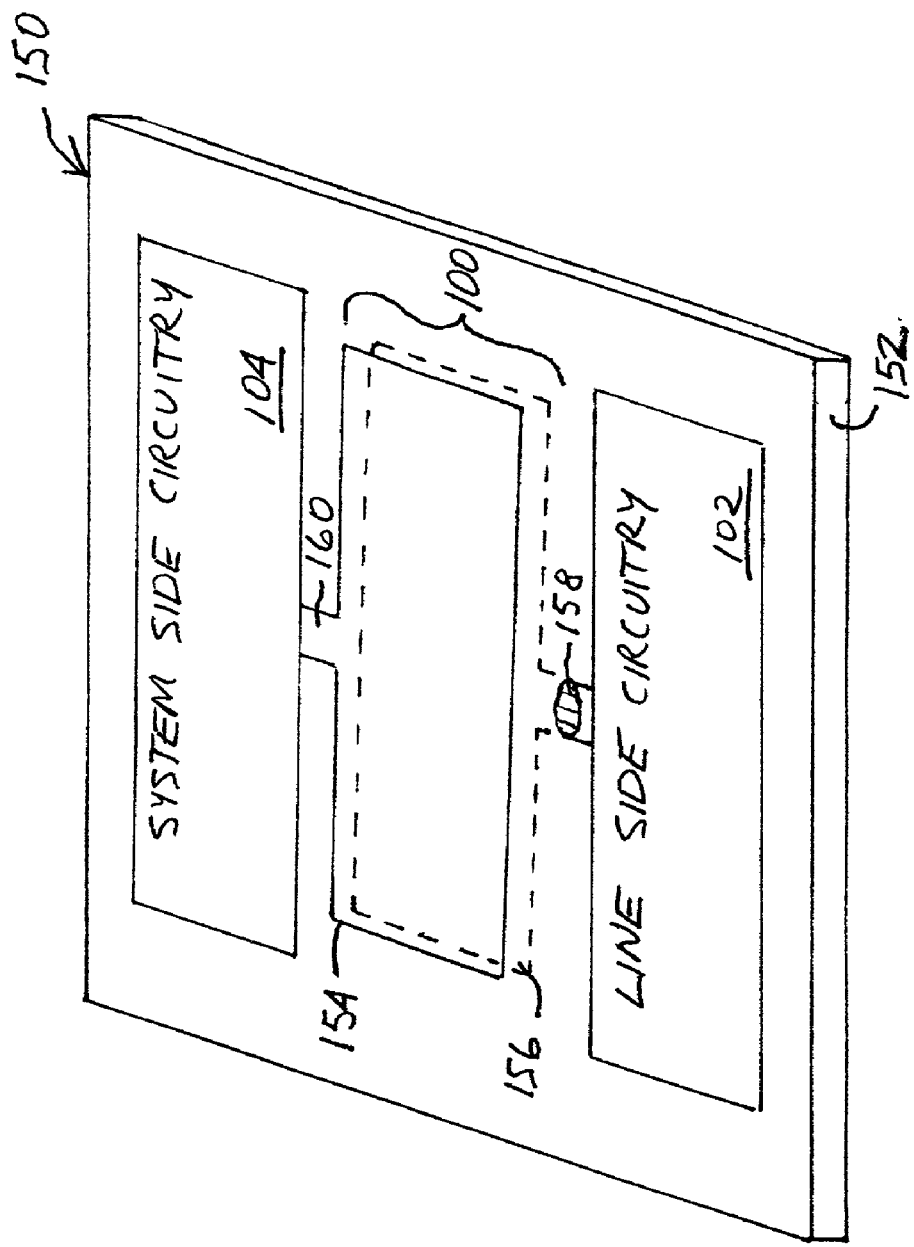

FIGS. 2A and 2B are perspective views of exemplary embodiments of a circuit board capacitor 100 as used with the data access arrangement of FIG. 1. In these embodiments, the capacitor electrodes 154 and 156 are formed on opposing sides of a printed circuit board 150. The overlapping area of the capacitor electrodes 154 and 156, in conjunction with the thickness and dielectric properties of the substrate 152 of the circuit board 150, determine the effective value of the circuit board capacitor 100. As shown in FIGS. 2A and 2B, the electrodes 154 and 156 may be geometrically shaped to utilize otherwise unused portions of the surfaces of the substrate 152. Further, although the illustrated electrodes 154 and 156 consume a relatively large portion of the surfaces of the substrate 152, it is contemplated that relatively small sized/value capacitor structures could be formed, and that each of the electrodes could comprise a plurality of separate but electrically coupled plates.

The electrodes 154 and 156 may be formed using conventional circuit board manufacturing techniques. These techniques include the use of a screening or photolithographic process in which unwanted portions of a layer of metal bonded to the substrate are selectively etched away in an acid etch bath after the metal layer has been coated with a photoresist material, exposed to a source of ultraviolet through a photo mask containing the desired pattern of electrodes and conductors, and then developed using, for example, a potassium carbonate solution. Polymer thick films and/or conductive inks may likewise be used in the formation of the electrodes 154 and 156. The electrodes may be composed of a number of materials, such as copper or aluminum.

Numerous alternate embodiments of the circuit board capacitor 100 and associated circuitry are contemplated. For example, a multi-layered printed circuit board, such as that discussed more fully below in conjunction with FIG. 3B, may be utilized in which two or more layers are used in the formation of the capacitor 100. Likewise, the circuit board capacitor 100 may connect communication circuitry located on more than one side of the circuit board 150. Further, more than one circuit board capacitor 100 may be used in a high voltage isolation barrier, such that differential communications and/or multiple datapaths can be realized.

Referring more specifically to FIG. 2A, system side circuitry 104 is electrically coupled to the electrode 154 by one or more conductive traces 160. Likewise, line side circuitry 102 is coupled to the electrode 156 by a conductive via structure 158. In this embodiment of the invention, the line side circuitry 102 and system side circuitry 104 are disposed on the same surface of the substrate 152, although it is contemplated that all or a portion of either the line side circuitry 102 or system side circuitry 104 may be disposed on the opposing surface of the substrate 152.

FIG. 2B is a perspective view of an alternate embodiment of a communication circuit utilizing a circuit board capacitor 100 implemented according to the present invention. In this embodiment, the electrodes 154 and 156 of the circuit board capacitor are formed on the surfaces of the substrate 152 in an area that is intermediate the line side circuitry 102 and the system side circuitry 104. As demonstrated by the differences between FIGS. 2A and 2B, the circuit board capacitor 100 may be implemented in a flexible manner that maximizes use of circuit board space.

Figure 3A:
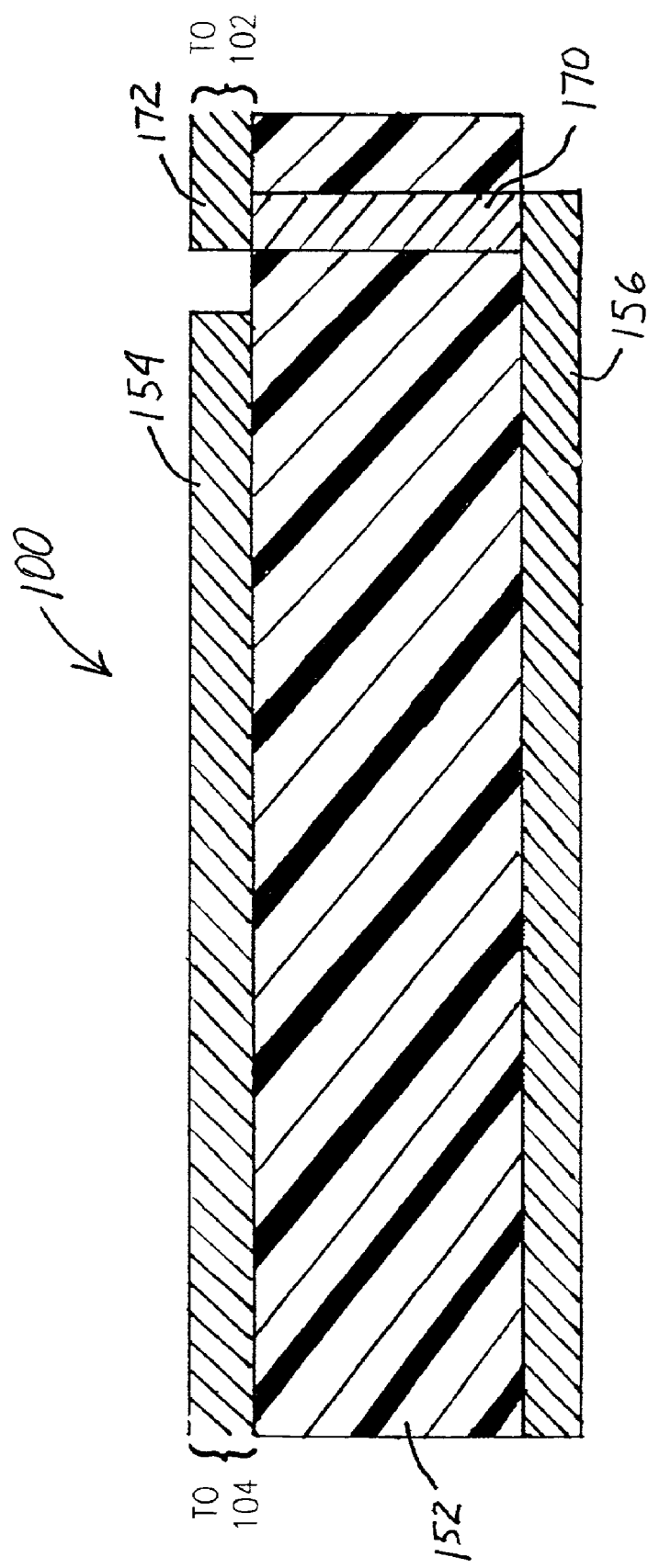
FIG. 3A is a cross-sectional view of a circuit board capacitor structure implemented according to the present invention.

FIG. 3A is a cross-sectional view of a circuit board capacitor structure 100 implemented according to the present invention. In this embodiment, the circuit board capacitor 100 is formed on the sides of a single substrate 152. In particular, the electrode 154 is disposed on a first side of the substrate 152, while the electrode 156 is formed on the opposing side of the substrate 152. In this example, both the line side circuitry 102 and system side circuitry 104 are disposed on the first side of the substrate 152. Accordingly, one or more conductive via structures 170 are provided to couple the electrode 156 to a conductive trace 172, which in turn is connected to the line side circuitry 102. The conductive via structure 170 may be a plated through-hole having a continuous coating of solder or other conductive material.

As previously noted, the dielectric properties of the substrate 152 and overlapping surface areas of the electrodes 154 and 156 determine the nominal value of the circuit board capacitor 100. The value of the circuit board capacitor 100 is generally inversely proportional to the thickness of the substrate 152. It is contemplated that laser trimming operations may be used to adjust the absolute value or tolerance of the circuit board capacitor 100.

It is noted that the dielectric properties of a fiberglass printed circuit board are well-suited to the formation of capacitors for high voltage applications. The substrate 152 generally must have a thickness adequate to provide structural support for the circuitry disposed thereon, although it is contemplated that flexible "circuit board" substrates may be used.

Figure 3B:
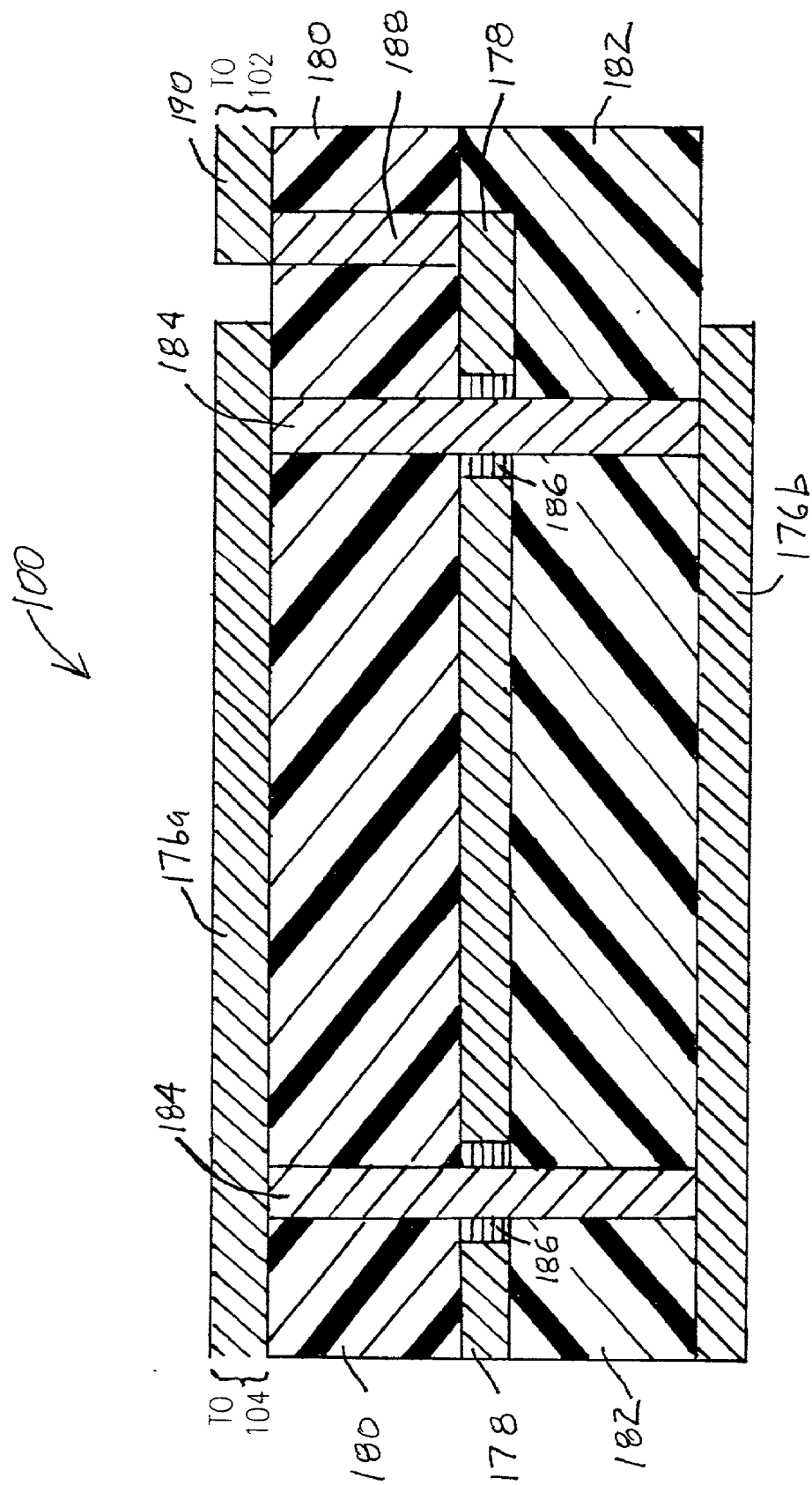
FIG. 3B is a cross-sectional view of a multi-layer circuit board capacitor structure implemented according to the present invention.

FIG. 3B is a cross-sectional view of a multi-layer circuit board capacitor structure implemented in accordance with the present invention. In this embodiment of the invention, a first electrode of the circuit board capacitor 100 is formed of portions 176*a* and 176*b* (collectively referred to as electrode 176) disposed on separate substrates 180 and 182 of a multi-layer circuit board. The electrode 176 operates in conjunction with a second electrode 178 to provide a capacitive structure. More particularly, the portion 176a of the electrode 176 is capacitively coupled to the electrode 178 by the substrate 180, while the portion 176b of the electrode 176 is capacitively coupled to the electrode 178 by a second substrate 182. The relationship between the electrodes can be visualized as two separate capacitors arranged in a parallel manner.

The portions 176a and 176b of the electrode 176 are electrically coupled by one or more conductive via structures 184 through the substrates 180 and 182. In the disclosed embodiment, through holes 186 are provided in the electrode 178 for the via structures 184. The electrode 178 is coupled to the line side circuitry 102 by a conductive via structure 188 and conductive trace 190. The disclosed arrangement is exemplary in nature, and it is considered that more than two substrates may be utilized in the formation of the circuit board capacitor 100.

Figure 4A:
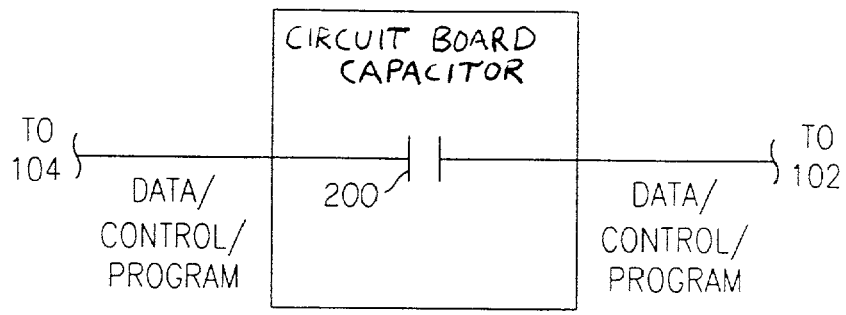
FIGS. 4A–4C are schematic diagrams providing exemplary details of various embodiments of a high voltage isolation barrier utilizing capacitor structures according to the present invention.
Figure 4B:
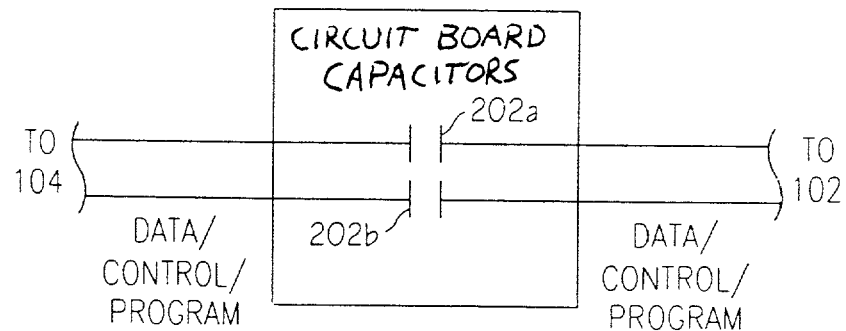
Figure 4C:
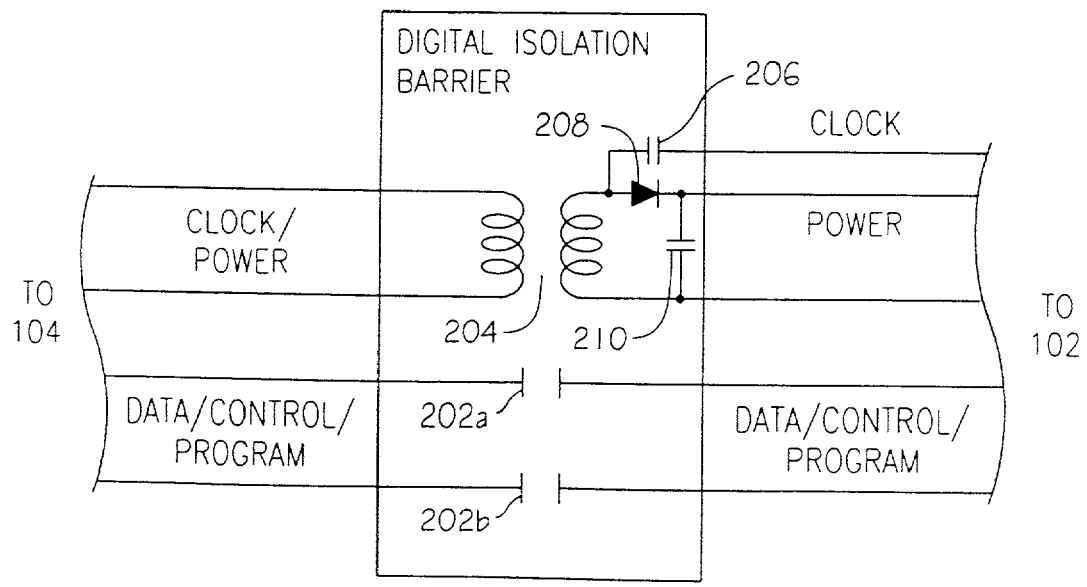

FIGS. 4A–4C are schematic diagrams providing exemplary details of various embodiments of a high voltage barrier utilizing capacitor structures according to the present invention. In each of these figures, the high voltage isolation barrier is represented by a rectangular symbol. Serial data, control and/or program signals, clock signals, and power signals may all be communicated across the high voltage isolation barrier.

Referring more particularly to FIG. 4A, an embodiment of the isolation barrier is depicted in which a serial data stream is communicated across a signal path employing a single circuit board capacitor 200. In this embodiment, transceiver circuitry located in the system side circuitry 104 and the line side circuitry 102 is configured to communicate a single-ended pulse train across the capacitor 200.

FIG. 4B depicts an embodiment of the isolation barrier having a differential configuration utilizing circuit board capacitors 202a and 202b. In this embodiment, a serial data stream comprising data, control and/or programming signals may be organized in the same manner as if the interface of FIG. 4A were utilized. However, the transceiver circuitry of the system side circuitry 104 and the line side circuitry 102 is configured for differential communications when utilized with the isolation barrier of FIG. 4B. As will be appreciated by those skilled in the art, utilizing differential voltages may improve signal integrity. A contemplated embodiment of such a configuration is discussed below in conjunction with FIG. 5.

FIG. 4C illustrates another contemplated embodiment for the isolation barrier. In this embodiment, a transformer 204 is added to the circuitry of FIG. 4B to communicate clock and power signals from the system side circuitry 104 to the line side circuitry 102. More specifically, the primary side of the transformer 204 is driven by the system side circuitry 104 such that clock and power signals of sufficient strength can be derived from the secondary side of the transformer 204. The clock signal, if provided, is coupled to the line side circuitry 102 via a relatively small value capacitor 206, which may be a circuit board capacitor such as that described above or a discrete capacitor. The power connections of the line side circuitry 102 are coupled to the secondary side of the transformer 204 via a half wave rectifier comprising a diode 208 and a charge storage capacitor 210. The diode 208 may be viewed as being a voltage regulating diode from certain perspectives, but a diode as known and understood in the art is operable to achieve the operation within the FIG. 4C. The capacitor 210 is provided across the power and ground connections of the line side circuitry 102 to provide a stable power supply voltage. The capacitor 210 is a discrete component in certain embodiments of the invention, yet the capacitor 210 may also be a circuit board capacitor in embodiment where the use of a circuit board capacitor may be practical.

Although the disclosed embodiment of FIG. 4C employs a half wave rectifier, a full wave rectifier or bridge rectifier could also be utilized. In another contemplated embodiment, clock and power signals are communicated across the isolation barrier via a separate pair of capacitors (not shown), which may be circuit board capacitors constructed in a manner described above.

Figure 5:
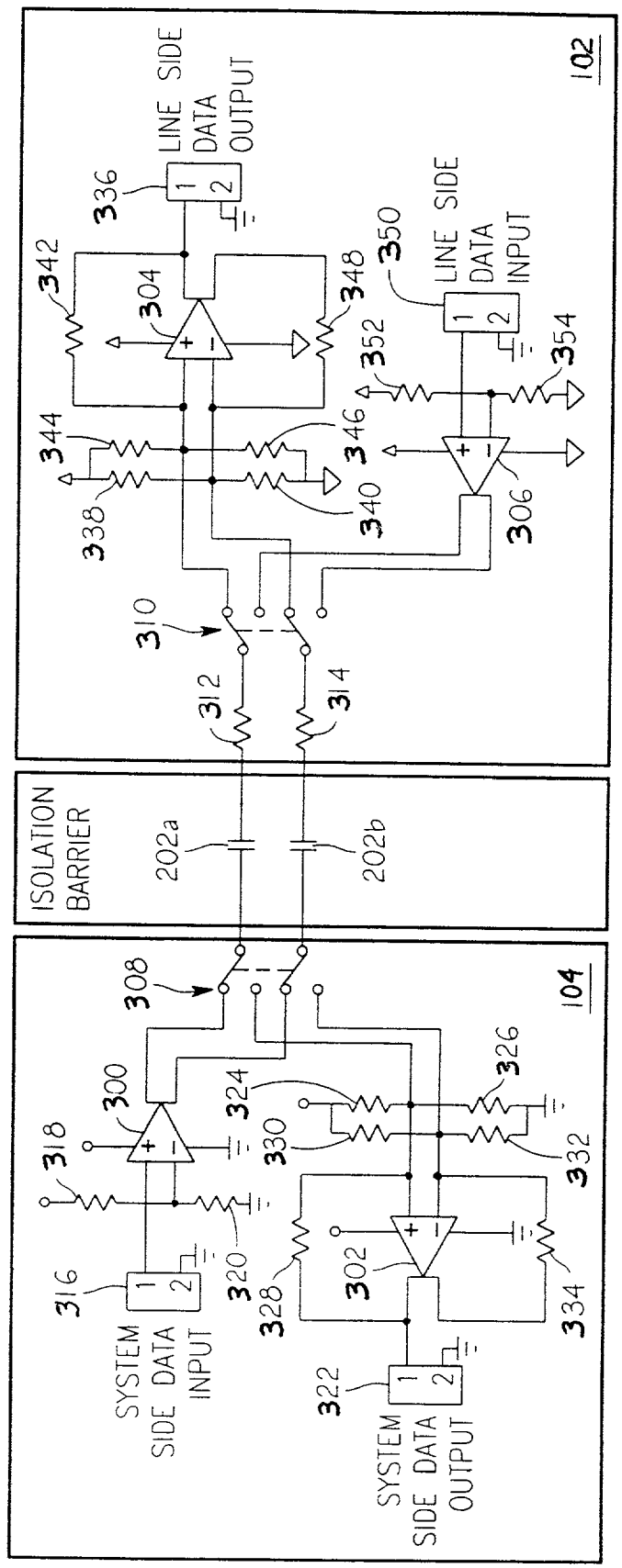
FIG. 5 is a block diagram providing exemplary details of differential driver circuitry for communicating across the high voltage isolation barrier of FIG. 4B or 4C.

FIG. 5 is a block diagram providing exemplary details of differential driver circuitry for communicating across a high voltage isolation barrier such as that of FIG. 4B or 4C. The disclosed circuitry provides for bi-directional serial communications across the circuit board capacitors 202a and 202b in a differential manner. To this end, transceiver circuitry comprising switchable line driver circuitry is utilized.

Referring more specifically to the transceiver circuitry of the system side circuitry 104, a first differential output comparator 300 is provided for driving signals across the isolation barrier, while a second comparator 302 is provided for receiving signals from the isolation barrier. An integrated double-pole double-throw switch 308 is provided to couple either the outputs of the comparator 300 or the inputs of the comparator 302 to the isolation barrier. The operation of the switch 308 is coordinated with the operation of an integrated double-pole double-throw switch 310 of the line side circuitry 102.

Data to be transmitted from the system side circuitry 104 is provided to the non-inverting input of the comparator 300 via a connection 316. Resistors 318 and 320 are coupled in series between system side power and ground to provide a reference voltage (at the common node) to the inverting input of the comparator 300. The reference voltage as determined by the ratio of the resistors 318 and 320, and is set to one half of the power supply voltage or other suitable voltage level.

When the system side circuitry 104 is receiving data across the circuit board capacitors 202a and 202b, the signals provided to the input of the comparator 302 of the disclosed embodiment require DC voltage reference levels for conversion of the incoming AC signals. To this end, the non-inverting input of the comparator 302 is coupled to the common node of a resistor divider formed by resistors 324 and 326. Similarly, the inverting input of the comparator 302 is coupled to the common node of a resistor divider network formed by resistors 330 and 332. A system side data output connection 322 is coupled to one output of the comparator 302. A feedback resistor 328 is coupled between this output and the non-inverting input of the op-amp 302 to provide hysteresis for purposes of noise immunity. Similarly, a feedback resistor 334 is coupled between the other output of the comparator 302 and its inverting input.

Current limiting resistors 312 and 314 are coupled between the isolation barrier and the poles of the double-poled double-throw switch 310 of the line side circuitry 102. Differential output comparators 304 and 306 are configured to receive and transmit signals, respectively, in a like manner to the comparators 300 and 302. More specifically, the outputs of the differential output comparator 306 are coupled to a paired side of the switch 310 in order to transmit data signals. The inverting input of the comparator 306 is provided a reference voltage by voltage divider formed of series connected resistors 352 and 354. The non-inverting input of the comparator 306 is coupled to a line side data input connection 350, and receives the input to be provided across the circuit board capacitors 202a and 202b.

The comparator 304 is configured to provide data to a line side data output connection 336 when the switch 310 is configured as illustrated. Accordingly, the inputs of the comparator 304 are coupled to a paired side of the double-pole double-throw switch 310. A DC bias voltage is established at the non-inverting input of the comparator 304 by a voltage divider formed of resistors 344 and 346. Similarly, a DC bias voltage is provided to the inverting input of the comparator 304 by resistor divider formed of resistors 338 and 340. A feedback resistor 342 is coupled between one output of the comparator 304 and its non-inverting input to provide hysteresis. Likewise, a feedback resistor 348 is coupled between the opposing output of the comparator 304 and its inverting input.

As will be apparent, control of the double-pole double-throw switches 308 and 310 may be synchronized by protocol framing and control circuitry in either or both of the line side circuitry 102 and system side circuitry 104. Many different transceiver circuit arrangements are possible for driving differential signals across the circuit board capacitors 202a and 202b, and it is not intended that this embodiment of the invention be limited to any one particular arrangement.

Thus, a circuit board capacitor structure has been described that is capable of being used, for example, as a high voltage isolation barrier in a data access arrangement, wherein it separates line side circuitry and system side circuitry. The capacitor structure can be flexibly arranged to maximize use of board space, and provides a cost-effective alternative to the discrete capacitors.

While various embodiments of the invention have been described, it will be apparent to those of ordinary skill in the art that many more embodiments and implementations are possible that are within the scope of this invention.

What is claimed is:

1. A high voltage isolation barrier structure, comprising:
a circuit board comprising a substrate, the substrate comprising a first side and a second side, the first side having a first circuitry and a second circuitry;
a capacitive structure comprising:
a plurality of first electrodes disposed on the first side of the substrate;
a plurality of second electrodes disposed on the second side of the substrate;
a plurality of conductive vias through the substrate; and
wherein the substrate intermediate the plurality of first and second electrodes functions as a dielectric material within the capacitive structure; and
the plurality of first electrodes is electrically coupled to said first circuitry; and
the plurality of conductive vias electrically couples the plurality of second electrodes to the second circuitry; and
the circuit further comprises a substrate having a first substrate and a second substrate, and the capacitive structure comprises:
a first electrode disposed on a first side of the first substrate;
a second electrode disposed on a first side of the second substrate;
a third electrode disposed on a second side of the first substrate and the second substrate, where the first substrate is stacked on top of the second substrate;
a first conductive via through the first substrate, the third electrode, and the second substrate connecting the first electrode and the second electrode and including a high voltage isolation barrier between the first conductive via and the third electrode;
a second conductive via through one of the first substrate or the second substrate connecting to the third electrode; and
wherein the substrate intermediate the first, second and third electrodes functions as a dielectric material within the capacitive structure.

2. The high voltage isolation barrier structure of claim 1, wherein the circuit board is contained within a data access arrangement.

3. The high voltage isolation barrier structure of claim 1, wherein the circuit board is a fiberglass circuit board.

4. The high voltage isolation barrier structure of claim 3, wherein the computer system further comprises a modem; and
the capacitive structure is contained within the modem.

5. The high voltage isolation barrier structure of claim 1, wherein the circuit board comprises radio frequency circuitry.

6. The circuit board capacitor structure of claim 1, wherein the circuit board comprises a multi-layer circuit board having a plurality of substrates.

7. A data access arrangement, comprising:
a circuit board having a substrate with a first side and a second side;
a conductive via through the substrate;
a high voltage isolation capacitor having a first electrode formed on the first side of the substrate and a second electrode formed on the second side of the substrate;
system side circuitry coupled to the first electrode and located on the first side; and
line side circuitry coupled to the second electrode and located on the first side;
wherein the conductive via couples the second electrode to the line side circuitry;
a third electrode contained within the substrate; and
wherein the conductive via through the substrate also extends through the third electrode and includes a high voltage isolation barrier between the via and the third electrode, the first electrode formed on the first side is electrically connected to the second electrode formed on the second side of the substrate, and the capacitor is formed between the first electrode and the second electrode as a first terminal and the third electrode as a second terminal.

8. The data access arrangement of claim 7, the system side circuitry is configurable to communicate with host system circuitry, and the line side is configurable to communicate over a telephone network.

9. The data access arrangement of claim 7, wherein the first and second electrodes are substantially overlapping.

10. The data access arrangement of claim 7, wherein at least two portions selected from a portion of the system side circuitry and a portion of the line side circuitry are formed on opposite sides of the substrate.

11. The data access arrangement of claim 7, the first and second electrodes being formed of copper.

12. The data access arrangement of claim 7, wherein data and control information are communicated between the system side circuitry and the line side circuitry in a serialized digital format via the capacitor.

13. The data access arrangement of claim 7, further comprising:
at least one additional capacitor having a first electrode formed on the first side of the substrate and a second electrode formed on the second side of the substrate, the at least one additional capacitor coupled between the system side circuitry and the line side circuitry.

14. The data access arrangement of claim 7, wherein the circuit board comprises a multi-layer circuit board having a plurality of substrates.

15. The data access arrangement of claim 7, the first electrode being formed on a plurality of substrates.

16. The data access arrangement of claim 7, wherein the first and second electrodes are printed on the substrate by a screening process.

17. A method of manufacturing a communications device, comprising:
 providing a circuit board having at least one substrate with a first side and a second side;
 forming a first electrode on the first side of the substrate;
 forming a second electrode on the second side of the substrate, wherein the substrate intermediate the first and second electrodes functions as a dielectric material such that a capacitive structure is formed;
 forming a conductive via through the substrate;
 electrically coupling first communication circuitry to the first electrode, the first communication circuitry being located on the first side; and
 electrically coupling second communication circuitry to the second electrode by the conductive via, the second communication circuitry being located on the first side;
 wherein forming the capacitive structure further comprises:
 forming a third electrode interior to the substrate;
 forming a via through the substrate and the third electrodes wherein the via electrically connects the first and second electrodes and provides a high voltage barrier to the third electrode; and
 wherein the substrate intermediate the first, second and third electrodes functions as a dielectric material such that a capacitive structure is formed.

18. The method of claim 17, wherein the first and second communication circuitry and capacitive structure form at least a portion of a data access arrangement.

19. The method of claim 18, the capacitive structure providing high voltage isolation between the first communication circuitry and the second communication circuitry.

20. The method of claim 17, wherein the first and second electrodes are substantially overlapping.

21. The method of claim 17, the step of forming a first electrode further comprising forming the first electrode on the sides of more than one substrate.

22. The method of claim 17, further comprising:
 providing the first communication circuitry on the first side of the substrate; and
 providing the second communication circuitry on the second side of the substrate.

23. The method of claim 17, wherein the first and second electrodes are printed on the substrate by a screening process.

24. The method of claim 17, wherein data is communicated between the first communication circuitry and the second communication circuitry via the capacitive structure.

25. A computer system, comprising:
 a data bus;
 a processor coupled to the data bus; and
 a modem coupled to the data bus, the modem comprising:
 a circuit board having a substrate with a first side and a second side;
 a capacitor having a first electrode formed on the first side of the substrate and a second electrode formed on the second side of the substrate; and
 a conductive via through the substrate;
 system side circuitry coupled to the first electrode, the system side circuitry configurable to communicate with the data bus; and
 line side circuitry coupled by the conductive via to the second electrode, the line side circuitry configurable to communicate with a telephone network;
 wherein the system side circuitry and the line side circuitry are located on the first side;
 wherein the capacitor comprises:
 a third electrode within the substrate;
 wherein the first electrode formed on the first side of the substrate and the second electrode formed on the second side of the substrate are electrically connected by the conductive via through the substrate and the third electrode, wherein a high voltage barrier exists between the conductive via and the third electrode.

26. The computer system of claim 25, wherein the capacitor provides high voltage isolation between the system side circuitry and the line side circuitry.

27. The computer system of claim 25, wherein the circuit board is a multi-layer circuit board having a plurality of substrates, the first electrode being formed on more than one substrate.

* * * * *